(12) United States Patent
Noma

(10) Patent No.: US 7,855,425 B2
(45) Date of Patent: Dec. 21, 2010

(54) SEMICONDUCTOR DEVICE AND METHOD OF MANUFACTURING THE SAME

(75) Inventor: Takashi Noma, Ota (JP)

(73) Assignees: Sanyo Electric Co., Ltd., Moriguchi-shi (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 12/527,990

(22) PCT Filed: Jan. 30, 2008

(86) PCT No.: PCT/JP2008/051884

§ 371 (c)(1),
(2), (4) Date: Aug. 20, 2009

(87) PCT Pub. No.: WO2008/123020

PCT Pub. Date: Oct. 16, 2008

(65) Prior Publication Data

US 2010/0096659 A1    Apr. 22, 2010

(30) Foreign Application Priority Data

Mar. 9, 2007   (JP) .............................. 2007-060206

(51) Int. Cl.
*H01L 31/02* (2006.01)
(52) U.S. Cl. ................................ 257/433; 257/E31.117
(58) Field of Classification Search ................. 257/433, 257/440, 434, 98–100, E21.052
See application file for complete search history.

(56) References Cited

U.S. PATENT DOCUMENTS 4,857,746 A    8/1989   Kuhlmann et al.

(Continued)

FOREIGN PATENT DOCUMENTS

CA    1061884    9/1979

(Continued)

OTHER PUBLICATIONS

International Search Report mailed Mar. 4, 2008, directed to PCT/JP2008/051884; 6 pages.

(Continued)

*Primary Examiner*—Nathan W Ha
(74) *Attorney, Agent, or Firm*—Morrison & Foerster LLP

(57) ABSTRACT

The invention is directed to providing a smaller semiconductor device having a light emitting element with a low manufacturing cost and a method of manufacturing the same. An adhesive layer 9 and conductive pastes 10a, 10b are selectively applied to a front surface of a semiconductor substrate 6. Then, a light emitting element (a LED die 4) is formed on the semiconductor substrate 6. A P type semiconductor layer 3 is connected to the conductive paste 10a, and an N type semiconductor layer 2 is connected to the conductive paste 10b. The LED die 4 is thus electrically connected to pad electrodes 8a, 8b through the conductive pastes 10a, 10b. Then, a protection layer 12 having openings in the positions corresponding to the pad electrodes 8a, 8b is formed on the semiconductor substrate 6. Electrode connection layers 13 and conductive terminals 14 are then formed on the pad electrodes 8a, 8b, 8c in the openings. The protection layer 12, the semiconductor substrate 6 and so on are then cut along a predetermined dicing line DL and separated into individual dies.

7 Claims, 14 Drawing Sheets

U.S. PATENT DOCUMENTS

| | | | | |
|---|---|---|---|---|
| 5,252,852 | A | * 10/1993 | Makiuchi et al. | 257/458 |
| 5,357,121 | A | * 10/1994 | Miyashita et al. | 257/79 |
| 7,365,364 | B2 | * 4/2008 | Huang et al. | 257/81 |
| 7,468,551 | B2 | * 12/2008 | Lin et al. | 257/686 |
| 7,576,402 | B2 | * 8/2009 | Noma | 257/432 |
| 7,582,944 | B2 | * 9/2009 | Fukuda et al. | 257/432 |
| 7,638,813 | B2 | * 12/2009 | Kinsman | 257/99 |

FOREIGN PATENT DOCUMENTS

| | | |
|---|---|---|
| DE | 26 50 770 | 5/1977 |
| DE | 3633181 | 4/1988 |
| JP | 52-57789 | 5/1977 |
| JP | 53-28387 | 3/1978 |
| JP | 63-102379 | 5/1988 |
| JP | 64-23584 | 1/1989 |
| JP | 03-191572 | 8/1991 |
| JP | 07-263754 | 10/1995 |
| JP | 09-283803 | 10/1997 |
| JP | 11-307878 | 11/1999 |
| JP | 2000-315062 | 11/2000 |
| JP | 2001-077406 | 3/2001 |
| JP | 2003-318447 | 11/2003 |
| JP | 2003-347583 | 12/2003 |
| JP | 2006-173197 | 6/2006 |
| NL | 7612271 | 5/1977 |

OTHER PUBLICATIONS

International Search Report mailed on Mar. 11, 2008 directed towards international application No. PCT/JP2008/051898; 6 pages.

* cited by examiner

SEMICONDUCTOR DEVICE AND METHOD OF MANUFACTURING THE SAME

REFERENCE TO RELATED APPLICATIONS

This application is a national stage application under 35 USC 371 of International Application No. PCT/JP2008/051884, filed Jan. 30, 2008, which claims priority from Japanese Patent Application No. 2007-060206, filed Mar. 9, 2007, the contents of which are incorporated herein by reference.

FIELD OF THE INVENTION

The invention relates to a semiconductor device having a light emitting element and a method of manufacturing the same.

BACKGROUND OF THE INVENTION

A light emitting diode (LED: Light Emitting Diode) can generate light stably for a long time with relatively low electric power, and is generally used as a light emitting element. A conventional semiconductor device having a light emitting element will be described referring to FIGS. 26 and 27.

As shown in FIG. 26, a conventional semiconductor device 100 has a first lead 101 (a cathode), a light emitting element (a LED die 102) disposed on the first lead 101, and a second lead 104 (an anode) electrically connected to the front surface electrode of the LED die 102 through a bonding wire 103. The portion of the first lead 101 on which the LED die 102 is disposed is formed into a concave shape. This concave portion 105 is plated with silver, for example. Therefore, the concave portion 105 functions as a light reflection surface, by which an attempt is made to enhance the luminance of light emitted from the LED die 102. Furthermore, the components described above are sealed with transparent resin 106.

The lighting on and off of this semiconductor device 100 are controlled by supplying a given voltage from other driver device (not shown) than the semiconductor device 100 to the first lead 101 and the second lead 104.

Furthermore, a conventional photocoupler (Photo coupler) will be described as a semiconductor device having a light emitting element. The photocoupler is a semiconductor device having a light emitting element and a light receiving element, and realizes signal transmission by converting an inputted electric signal into light by the light emitting element and making the light receiving element conductive with the light.

As shown in FIG. 27, a conventional photocoupler 110 has an LED die 111 as a light emitting element and a PD (Photo Diode) die 112 as a light receiving element. The LED die 111 and the PD die 112 are disposed so as to face each other, and electrically connected to leads 114 through bonding wires 113. The LED die 111 and the PD die 112 are sealed with transparent resin 115, and further sealed with mold resin 116 that blocks light. The LED die 111 and the PD die 112 are not electrically connected. In this photocoupler 110, signal transmission is achieved by converting an inputted electric signal into a light signal at the LED die 111 and making the PD die 112 conductive with this light.

Relevant technologies to the invention are described in Japanese Patent Application Publication Nos. 2003-318447 and 2003-347583, for example.

In the conventional semiconductor device 100 (FIG. 26) described above, it is difficult to make the first lead 101 having the concave portion 105, the second lead 104 and so on finer, and all of these need be sealed with the transparent resin 106. Therefore, there is a problem of difficulty in making the whole size smaller. Furthermore, since it is necessary to perform an assembling work after each of the components is completed separately, there is a problem of complex manufacturing processes and an increased cost.

On the other hand, in the photocoupler 110 (FIG. 27) described above, since it is necessary to dispose the LED die 111 and the PD die 112 on the leads 114 so that these face each other, connect the bonding wires 113 to the LED die 111 and the PD die 112, respectively, and so on, it is also difficult to make the whole size smaller and the manufacturing processes are complex.

As described above, a conventional semiconductor device having a light emitting element has a problem of impossibility in making the whole device smaller and thinner and an increased manufacturing cost.

SUMMARY OF THE INVENTION

Therefore, the invention is directed to providing a smaller semiconductor device with a low manufacturing cost and high reliability, and a method of manufacturing the same.

The invention is to address the above problem and the main feature is as follows. A semiconductor device of the invention includes: a first substrate; first and second pad electrodes formed on a front surface of the first substrate; a light emitting element having a region of a first conductive type and a region of a second conductive type on a first surface, the first surface being formed so as to face the front surface of the first substrate; an adhesive layer formed between the light emitting element and the first substrate; a first conductive member formed between the light emitting element and the first substrate and electrically connecting the region of the first conductive type and the first pad electrode; and a second conductive member formed between the light emitting element and the first substrate and electrically connecting the region of the second conductive type and the second pad electrode.

A semiconductor device of the invention includes: a first substrate; first and second pad electrodes formed on a front surface of the first substrate; a light emitting element having a region of a first conductive type on a first surface and a region of a second conductive type on a second surface, the first surface being formed so as to face the front surface of the first substrate; an adhesive layer formed between the light emitting element and the first substrate; a first conductive member formed on the front surface of the first substrate and electrically connecting the region of the first conductive type and the first pad electrode; and a second conductive member formed on the front surface of the first substrate and electrically connecting the region of the second conductive type and the second pad electrode.

Furthermore, the main feature of a method of manufacturing a semiconductor device of the invention is as follows. A method of manufacturing a semiconductor device of the invention includes: providing a wafer-shaped first substrate having a first pad electrode and a second pad electrode formed on a front surface; forming a first conductive member and a second conductive member selectively on the front surface of the first substrate; forming a light emitting element having a region of a first conductive type and a region of a second conductive type on a first surface on the front surface of the first substrate with an adhesive layer being interposed therebetween so that the first surface faces the front surface of the first substrate; electrically connecting the first pad electrode and the region of the first conductive type through the first conductive member between the light emitting element and the first substrate, and electrically connecting the second pad electrode and the region of the second conductive type through the second conductive member between the light emitting element and the first substrate; and cutting the first substrate along a predetermined line and separating it into individual dies.

A method of manufacturing a semiconductor device of the invention includes: providing a wafer-shaped first substrate having a first pad electrode and a second pad electrode on a front surface; forming a light emitting element having a region of a first conductive type on a first surface and a region of a second conductive type on a second surface on the front surface of the first substrate with an adhesive layer being interposed therebetween so that the first surface faces the front surface of the first substrate; electrically connecting the first pad electrode and the region of the first conductive type through a first conductive member, and electrically connecting the second pad electrode and the region of the second conductive type through a second conductive member; and cutting the first substrate along a predetermined line and separating it into individual dies.

Different from the conventional structure, in the structure of the invention the dies are united from in the wafer state. Furthermore, since the components of the semiconductor device are formed by a wafer process, the formation of finer components is achieved. This realizes a thinner and smaller semiconductor device.

Furthermore, the semiconductor device is completed as a die at the time of separation into individual semiconductor devices in the invention, different from the conventional where a plurality of components is manufactured, separately and a semiconductor device is completed through a subsequent assembling work. This omits processes such as a subsequent assembling work to decrease the manufacturing cost, and achieves enhancement in the workability and productivity of a semiconductor device having a light emitting element.

DETAILED DESCRIPTION OF THE INVENTION

A first embodiment of the invention will be described referring to figures. FIGS. 1 to 9 are cross-sectional views in manufacturing process order.

Figure 1:
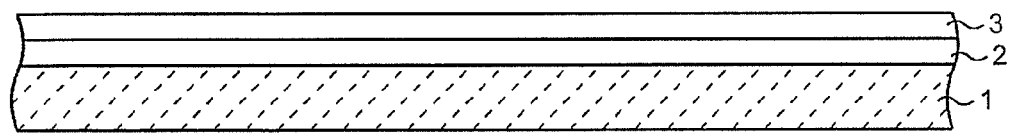
FIG. 1 is a cross-sectional view for explaining a semiconductor device and a method of manufacturing the same of a first embodiment of the invention.

First, as shown in FIG. 1, an N type semiconductor substrate 1 made of, for example, gallium arsenide (GaAs), gallium nitride (GaN) or the like is provided. The material of the semiconductor substrate 1 may be appropriately changed according to a target color of emission light. An N type semiconductor layer 2 and a P type semiconductor layer 3 are then sequentially formed on the front surface of the semiconductor substrate 1 by an epitaxial crystal growth method. A PN junction region made by these is to be a light emitting region. N type impurities added to the semiconductor substrate 1 and the N type semiconductor layer 2 are sulfur (S), selenium (Se), tellurium (Te) or the like, for example. P type impurities added to the P type semiconductor layer 3 are zinc (Zn), for example.

Figure 2:
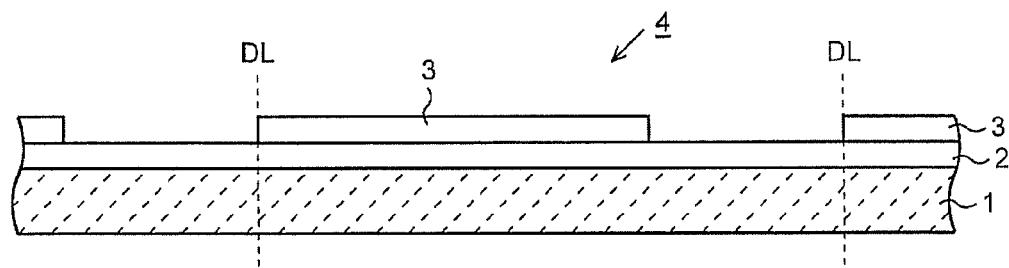
FIG. 2 is a cross-sectional view for explaining the semiconductor device and the method of manufacturing the same of the first embodiment of the invention.

Then, a part of the P type semiconductor layer 3 is selectively removed by, for example, a dry-etching method to expose a part of the N type semiconductor layer 2 as shown in FIG. 2. Then, the wafer-shaped semiconductor substrate 1 is separated along predetermined dicing lines DL into individual dies (hereafter, referred to as LED dies 4). Since the LED die 4 has both the exposed P type region (the P type semiconductor layer 3) and N type region (the N type semiconductor layer 2) on its one surface side, power supply to each of the layers is achieved from the same surface side. The description given above is an example of the method of manufacturing a light emitting element, and the manufacturing process differs according to desired characteristics (e.g. a color of emission light or the like).

There is also a case in which electrodes are formed on the N type semiconductor layer 2 and the P type semiconductor layer 3 respectively before the semiconductor substrate 1 is separated into the LED dies 4. In this case, a metal layer made of aluminum (Al), copper (Cu) or the like is formed by a thin film deposition technique such as, for example, a sputtering method or the like, and then the metal layer is selectively etched using a resist layer (not shown) as a mask to form the electrodes on the N type semiconductor layer 2 and the P type semiconductor layer 3 respectively.

Figure 3:
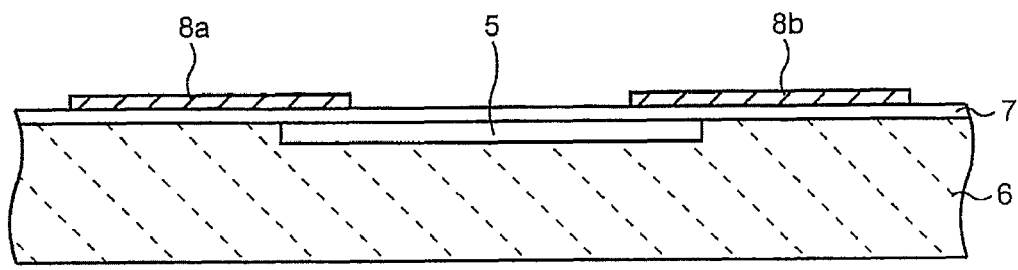
FIG. 3 is a cross-sectional view for explaining the semiconductor device and the method of manufacturing the same of the first embodiment of the invention.

Then, as shown in FIG. 3, a wafer-shaped semiconductor substrate 6 made of, for example, silicon (Si) or the like having a device element 5 on the front surface is provided. There is no limitation in the type and function of the device element 5, and for example, the device element 5 preferably includes a driver element that controls the lighting on and off of the LED die 4. The device element 5 may be a light receiving element having a function of converting light from a photodiode (a Photo Diode), a phototransistor (a Photo Transistor) or the like into an electric signal, and this structure realizes a small photocoupler as described below. The thickness of the semiconductor substrate 6 is 300 to 700 μm, for example.

Figure 5:
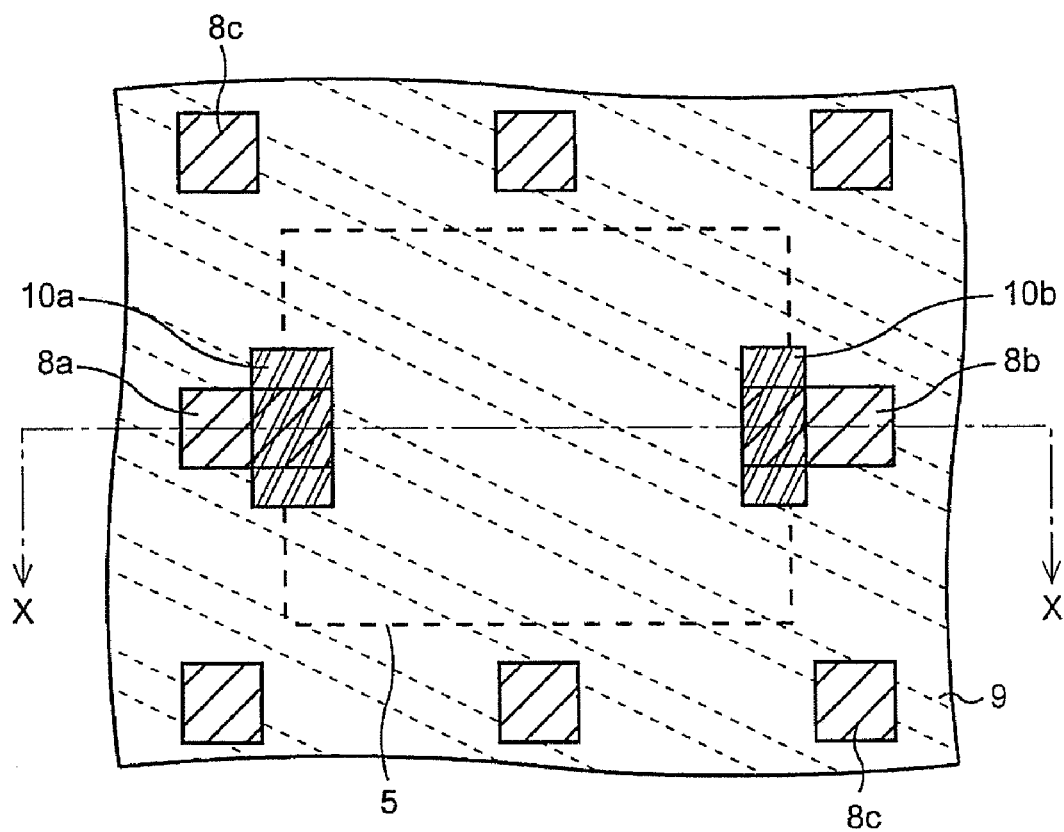
FIG. 5 is a plan view for explaining the semiconductor device and the method of manufacturing the same of the first embodiment of the invention.

Then, a first insulation film 7 (e.g. a silicon oxide film formed by a thermal oxidation method, a CVD method or the like) is formed on the front surface of the semiconductor substrate 6 so as to have a thickness of, for example, 2 μm. A metal layer made of aluminum (Al), an aluminum alloy, copper (Cu) or the like is then formed by a sputtering method, a plating method, or other deposition method, and then this metal layer is selectively etched to form a plurality of pad electrodes 8a, 8b, 8c having a thickness, for example, 1 μm on the first insulation film 7. The pad electrodes 8a, 8b are electrodes for external connection that are electrically connected to the LED die 4 as described below. The pad electrodes 8c are shown in FIG. 5, and these are electrodes electrically connected to the device element 5 or other peripheral elements through wirings (not shown). Although the pad electrodes 8a, 8b, 8c are disposed on both the sides of the device element 5 in FIGS. 3 and 5, the position is not limited and these may be disposed on the device element 5.

Figure 4:
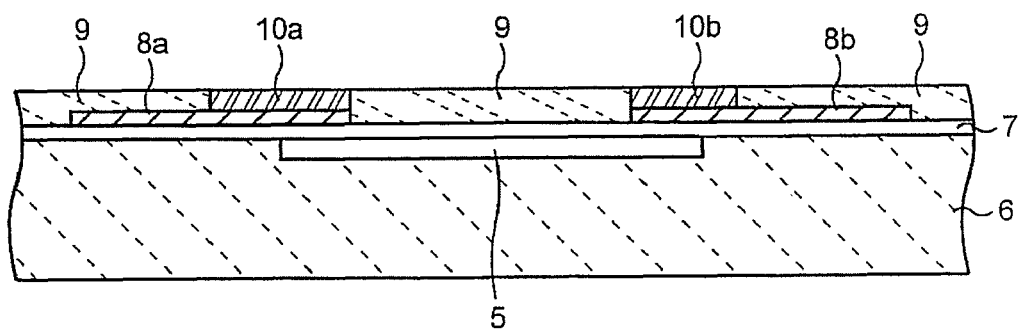
FIG. 4 is a cross-sectional view for explaining the semiconductor device and the method of manufacturing the same of the first embodiment of the invention.

Then, as shown in FIGS. 4 and 5, an insulating adhesive layer 9 made of, for example, epoxy resin, polyimide (e.g. photosensitive polyimide), a resist, acrylic or the like and conductive pastes 10a, 10b made by mixing, for example, a conductive material such as silver (Ag) or the like and an adhesive material such as epoxy resin or the like are selectively applied to the front surface of the semiconductor substrate 6. The adhesive layer 9 mainly has a role of attaching the LED die 4 and the semiconductor substrate 6. In a case of manufacturing a photocoupler, the adhesive layer 9 is preferably made of a suitable material having properties of being transparent and transmitting light since it is a path of light emitted from the LED die 4. The conductive pastes 10a, 10b mainly has a role of electrically connecting the P type region (the P type semiconductor layer 3) and the N type region (the N type semiconductor layer 2) of the LED die 4 to the pad electrodes 8a, 8b. The conductive pastes 10a, 10b are applied so as to cover at least parts of the pad electrodes 8a, 8b as shown in FIG. 5, and the adhesive layer 9 is applied to the other region. FIG. 5 is a schematic plan view for explaining the regions for forming the adhesive layer 9 and the conductive pastes 10a, 10b, and FIG. 4 corresponds to a cross-sectional view of FIG. 5 along line X-X.

Figure 6:
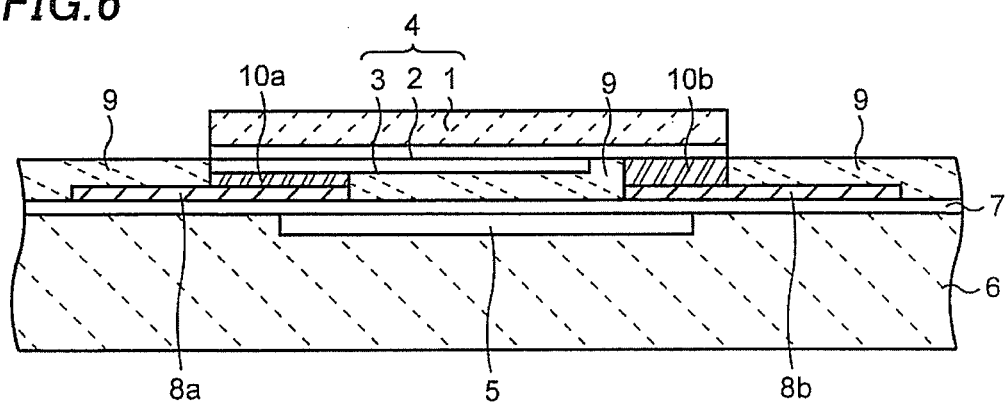
FIG. 6 is a cross-sectional view for explaining the semiconductor device and the method of manufacturing the same of the first embodiment of the invention.

Then, as shown in FIG. 6, the LED die 4 is attached to the semiconductor substrate 6 so as to connect the P type semiconductor layer 3 to the conductive paste 10a and connect the N type semiconductor layer 2 to the conductive paste 10b. The LED die 4 is fixed to the semiconductor substrate 6 with the adhesiveness of the adhesive layer 9 and the conductive pastes 10a, 10b.

Figure 7:
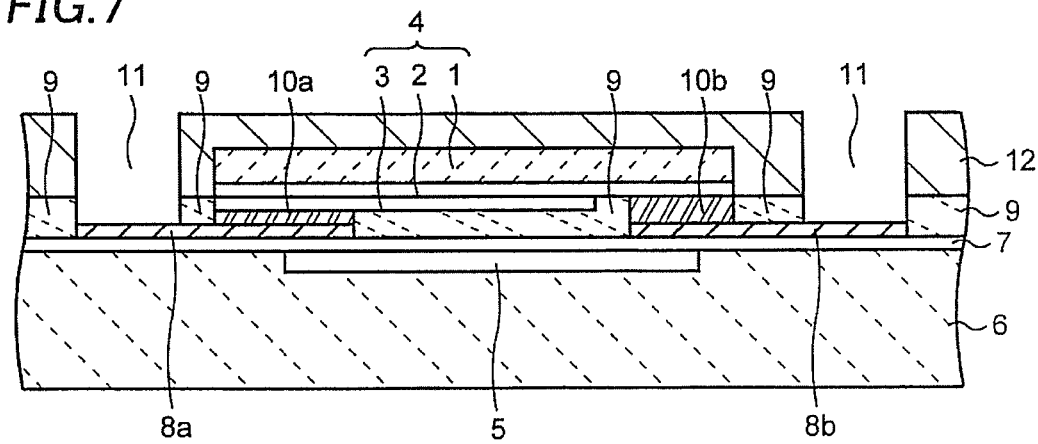
FIG. 7 is a cross-sectional view for explaining the semiconductor device and the method of manufacturing the same of the first embodiment of the invention.

Then, as shown in FIG. 7, a protection layer 12 having openings 11 in the positions corresponding to the pad electrodes 8a, 8b, 8c (not shown) is formed. The protection layer 12 is made of, for example, an organic type material such as polyimide type resin, a solder resist or the like, and has properties of being transparent and transmitting light. The protection layer 12 is formed in the following manner, for example. First, an organic type material having high light transmittance is applied (e.g. by spin application) to the whole surface by an applying/coating method, and a heat treatment (pre-baking) is performed thereto. Exposure and development are then performed to the applied organic type material to form the openings 11 exposing the conductive pastes 10a, 10b and the adhesive layer 9, and then a heat treatment (post-baking) is performed thereto. The conductive pastes 10a, 10b and the adhesive layer 9 exposed at the bottoms of the openings 11 are then etched to expose the pad electrodes 8a, 8b, 8c.

Figure 8:
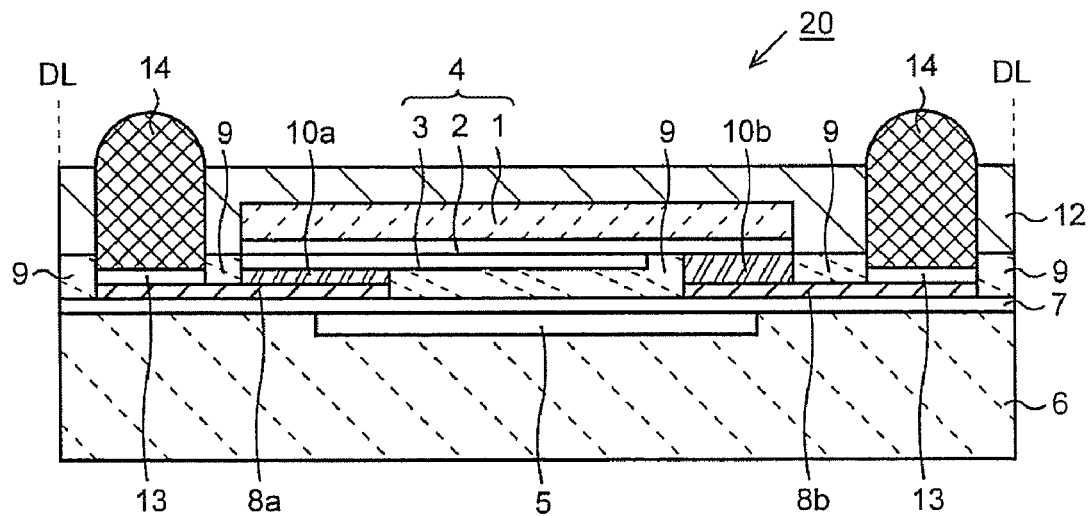
FIG. 8 is a cross-sectional view for explaining the semiconductor device and the method of manufacturing the same of the first embodiment of the invention.

Then, as shown in FIG. 8, electrode connection layers 13 are formed on the pad electrodes 8a, 8b, 8c in the openings 11. The electrode connection layers 13 are formed because the pad electrodes 8a, 8b, 8c made of aluminum or the like and the conductive terminals 14 made of solder or the like that will be described below are rather difficult to be attached together and for the purpose of preventing the material of the conductive terminals 14 from entering the pad electrodes 8a, 8b, 8c side. The electrode connection layers 13 may be formed by, for example, a lift-off method in which metal layers such as a nickel (Ni) layer and a gold (Au) layer are sequentially sputtered using a resist layer as a mask and then the resist layer is removed, or a plating method.

Then, a conductive material (e.g. solder) is screen-printed on the electrode connection layers 13 in the openings 11, and this conductive material is reflowed by a heat treatment. By this, conductive terminals 14 are formed, which are electrically connected to the LED die 4 through the electrode connection layers 13 and the conductive pastes 10a, 10b and electrically connected to the device element 5 through the electrode connection layer 13 and the pad electrode 8c. Although FIG. 8 shows the electrical connection of the LED die 4 and the conductive terminals 14 only, the device element 5 is connected to the conductive terminal 14 in other region. The conductive terminals 14 are electrodes that are formed slightly higher than the height of the protection layer 12 and protrude from the front surface of the protection layer 12 in the thickness direction thereof. The protrusion of the conductive terminals 14 facilitates the mounting on a printed board or the like. The method of forming the conductive terminals 14 is not limited to the above, and the conductive terminals 14 may be also formed by an electrolytic plating method, a so-called dispensing method (an applying method) in which solder or the like is applied to predetermined regions using a dispenser, or the like. The conductive terminals 14 may be made of gold, copper or nickel, and the material is not limited particularly.

Then, the protection layer 12, the semiconductor substrate 6 and so on are cut off along predetermined dicing lines DL and the wafer-shaped semiconductor substrate 6 is separated into individual dies. There are a dicing method, an etching method, a laser cutting method and so on, as a method of separating these into individual dies.

Figure 9:
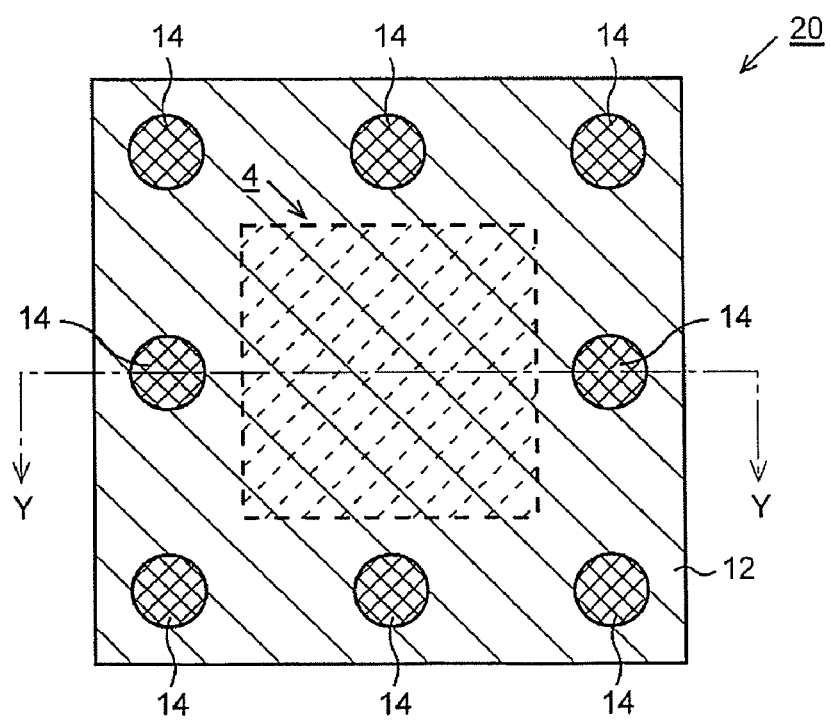
FIG. 9 is a plan view for explaining the semiconductor device and the method of manufacturing the same of the first embodiment of the invention.

By the processes described above, a semiconductor device 20 of a chip size package type having the light emitting element (the LED die 4) on the semiconductor substrate 6 is completed as shown in FIGS. 8 and 9. The semiconductor device 20 is mounted on a printed-board or the like through the conductive terminals 14. FIG. 9 is a schematic plan view of the semiconductor device 20 on the LED die 4 side, and FIG. 8 corresponds to a cross-sectional view of FIG. 9 along line Y-Y.

Figure 26:
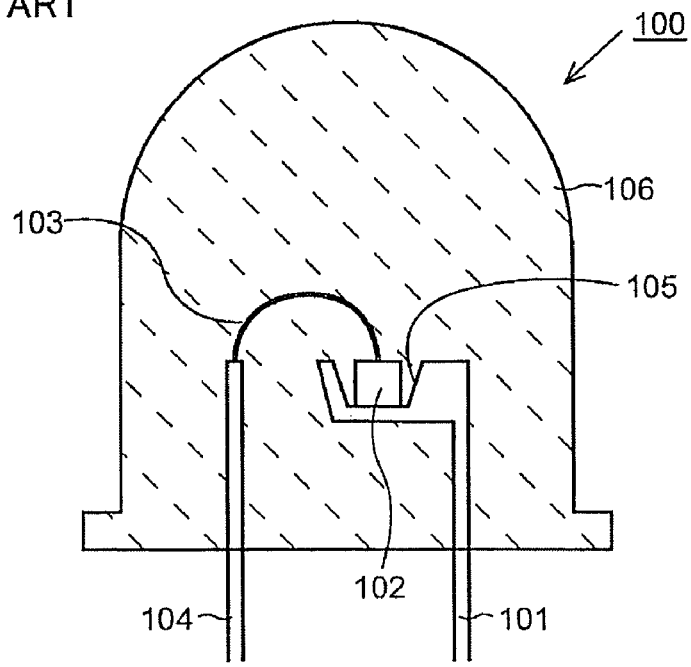
FIG. 26 is a cross-sectional view for explaining a conventional semiconductor device.

Unlike the conventional structure (refer to FIG. 26) in which the components (the LED die, the lead, the bonding wire) are separately formed, the semiconductor devices 20 of the embodiment are configured by integrally forming the dies from in the wafer state of the semiconductor substrate 6. Furthermore, since the components of the semiconductor device are formed by a wafer process, the formation of finer components than in the conventional structure is achieved. Furthermore, the LED die 4 has a structure that realizes power supply from the surface facing the semiconductor substrate 6, and is connected to the electrodes for external connection (the pad electrodes 8a, 8b, the conductive terminals 14) through the thin conductive members (the conductive pastes 10a, 10b) instead of using a wire such as a bonding wire that provides a certain thickness. This realizes a thinner and smaller semiconductor device.

Furthermore, although conventionally a plurality of components is manufactured separately and devices are then completed by assembling these, in the embodiment the semiconductor device is completed as a die at the time of separation into individual semiconductor devices. This omits an assembling work (a process of disposing a LED die on a lead, a process of connecting a LED die and a lead using a bonding wire, a process of sealing the whole with transparent resin, and so on, that are conventionally included), and also enhances the workability and productivity of a semiconductor device having a light emitting element.

Since the device element 5 is formed on the semiconductor substrate 6 in addition to the light emitting element (the LED die 4), multiple elements are effectively formed together in a die and thus a multi-functional semiconductor device having a light emitting element is obtained. For example, by providing the device element 5 with a driver element that controls the lighting on and off of the LED die 4, both of light emitting and control functions are realized in a die. Therefore, different from the conventional device (FIG. 26), there is no need to provide other driver device than the semiconductor device. In this case, the LED die 4 and the device element 5 are electrically connected by forming a wiring layer at the time of forming the pad electrodes 8a, 8b, 8c or the like or by providing a wiring on a mounting board side.

Figure 27:
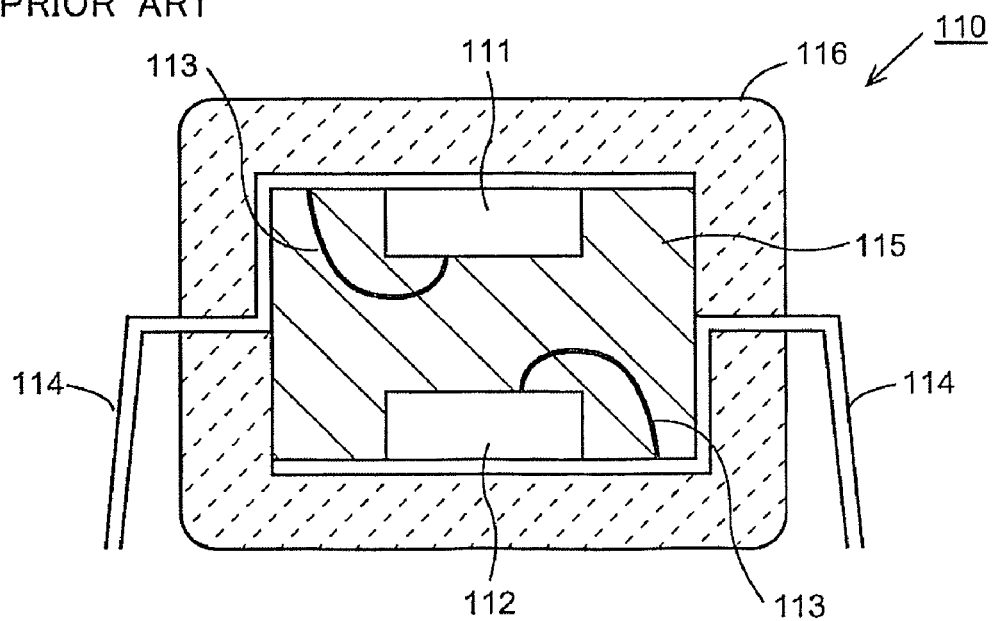
FIG. 27 is a cross-sectional view for explaining a conventional semiconductor device.

Furthermore, the semiconductor device 20 may be used as a photocoupler by providing the device element 5 with a light receiving element such as a photodiode (a Photo Diode), a phototransistor (a Photo Transistor) or the like. Although the conventional photocoupler (refer to FIG. 27) is manufactured by completing two dies (the LED die and the PD die) separately and uniting these through a subsequent assembling work, in the embodiment dies are integrally formed from in the wafer state. Furthermore, the components of the photocoupler are formed by a wafer process. Furthermore, since a bonding wire is not used, the space between the LED die 4 and the device element 5 is much thinner than in the conventional structure. This realizes a thinner and smaller photocoupler. Furthermore, since a conventional assembling work (a process of disposing a light emitting element and a light receiving element on leads so that these face each other, a process of filling a space between dies with transparent resin, and so on) is omitted, the workability and productivity of a photocoupler are enhanced. In this case, it is not necessary to electrically connect the light receiving element and the LED die 4.

Figure 10:
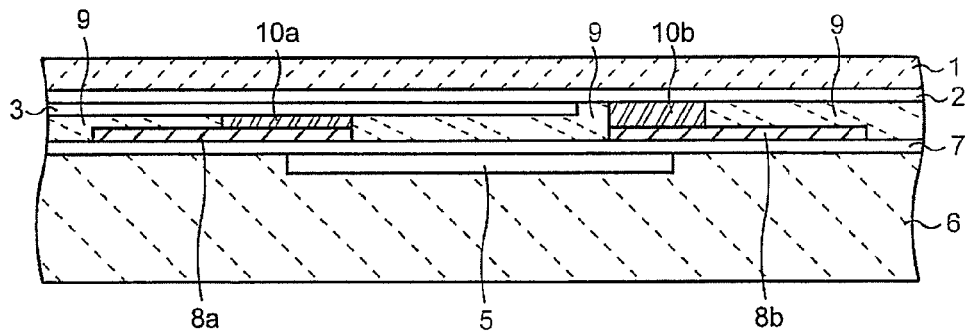
FIG. 10 is a plan view for explaining the semiconductor device and the method of manufacturing the same of the first embodiment of the invention.

Although in the first embodiment the wafer-shaped semiconductor substrate 1 is separated into each of the LED dies 4 first and then the LED dies 4 are disposed on the semiconductor substrate 6, the following manufacturing process may be also employed instead. First, as shown in FIG. 2, the wafer-shaped semiconductor substrate 1 in which the P type semiconductor layer 3 is selectively removed to expose a part of the N type semiconductor layer 2 is provided. Then, as shown in FIG. 10, the semiconductor substrate 1 and the semiconductor substrate 6 are attached with the conductive pastes 10a, 10b and the adhesive layer 9 being interposed therebetween, in the same manner as described above. The semiconductor substrate 1 is then selectively etched from the back surface, and the wafer-shaped semiconductor substrate 1 is divided into each of the LED dies 4. In this manufacturing process, since the semiconductor substrate 6 serves as a supporting body to facilitate a process of grinding the whole back surface of the semiconductor substrate 1 (a back-grinding process), there is a merit that the LED dies 4 are formed thinner.

Next, a second embodiment of the invention will be described referring to figures. FIGS. 11 to 16 are cross-sectional views in manufacturing process order. The description of the same structure and manufacturing processes as those of the first embodiment is omitted or simplified.

First, as shown in FIGS. 1 and 3, the wafer-shaped semiconductor substrate 1 having the N type semiconductor layer 2 and the P type semiconductor layer 3 formed on the front surface and the wafer-shaped semiconductor substrate 6 having the device element 5, the first insulation film 7 and the pad electrodes 8a, 8b, 8c (not shown) formed on the front surface are provided.

Figure 11:
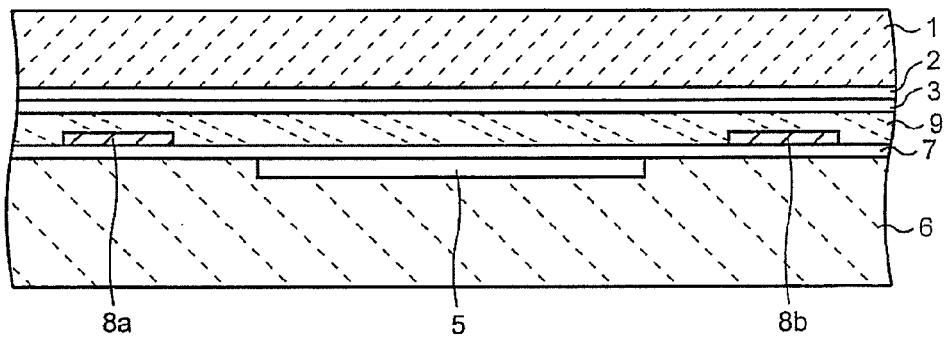
FIG. 11 is a cross-sectional view for explaining the semiconductor device and the method of manufacturing the same of the first embodiment of the invention.

Then, as shown in FIG. 11, the semiconductor substrate 1 and the semiconductor substrate 6 are attached with the adhesive layer 9 being interposed therebetween so that the P type semiconductor layer 3 faces the front surface of the semiconductor substrate 6. The whole back surface of the semiconductor substrate 1 is then ground using a back surface grinder (a grinder) to thin the semiconductor substrate 1 to a predetermined thickness. The grinding process may be replaced by an etching treatment, or the combination of the grinder and the etching treatment. There is also a case where the grinding process is not necessary depending on the application or specification of an end-product and the initial thickness of the provided semiconductor substrate 1. Since the ground surface by the grinding process may become rough, for example, a wet etching treatment may be performed after the grinding process, as a process for obtaining a smooth surface.

Figure 12:
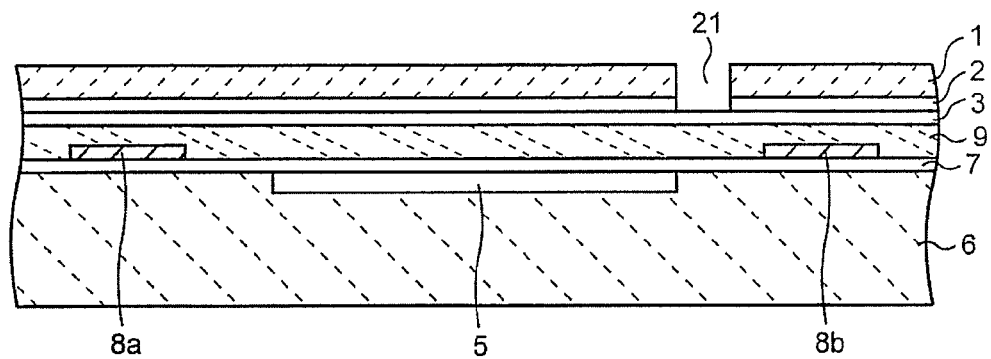
FIG. 12 is a cross-sectional view for explaining a semiconductor device and a method of manufacturing the same of a second embodiment of the invention.

Then, a predetermined region of the semiconductor substrate 1 and the N type semiconductor layer 2 is selectively etched from the back surface side of the semiconductor substrate 1 using a resist layer (not shown) as a mask to form an opening 21 exposing a part of the P type semiconductor layer 3 as shown in FIG. 12.

Figure 13:
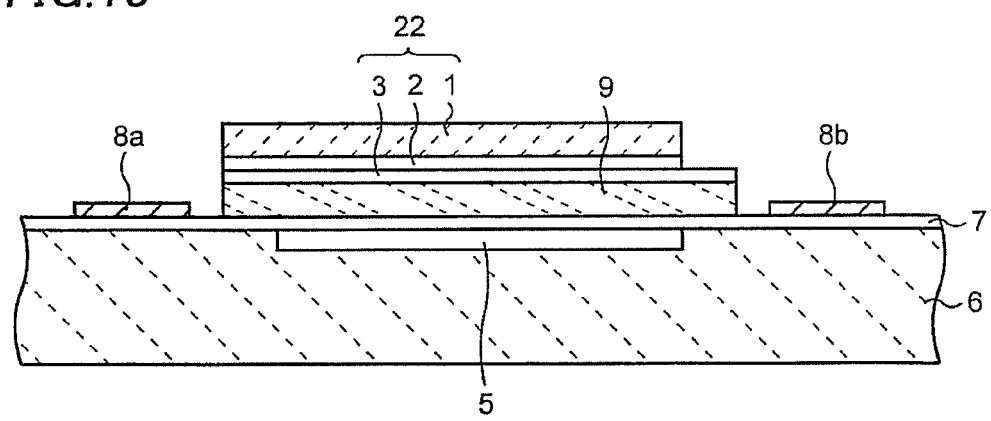
FIG. 13 is a cross-sectional view for explaining the semiconductor device and the method of manufacturing the same of the second embodiment of the invention.

Then, the semiconductor substrate 1, the N type semiconductor layer 2, the P type semiconductor layer 3 and the adhesive layer 9 are selectively etched using other resist layer as a mask to expose the pad electrodes 8a, 8b, 8c as shown in FIG. 13. The P type semiconductor layer 3 that is exposed by the formation of the opening 21 is not etched. By this etching, the wafer-shaped semiconductor substrate 1 is divided into individual dies (hereafter, referred to as LED dies 22). The LED die 22 has both the exposed P type region (the P type semiconductor layer 3) and N type region (the semiconductor substrate 1) on the surfaces on the side not facing the semiconductor substrate 6. The LED die 22 differs from the structure of the LED die 4 of the first embodiment in this point.

Figure 14:
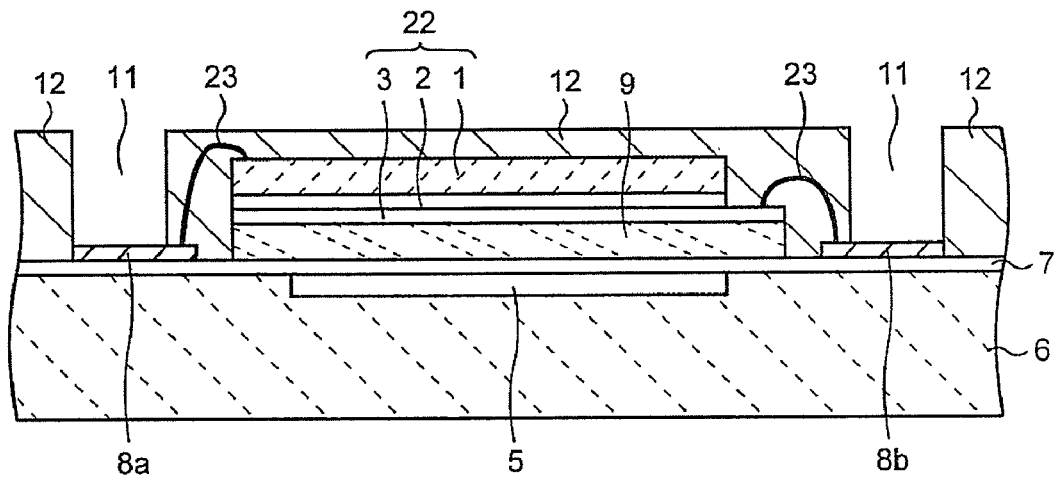
FIG. 14 is a cross-sectional view for explaining the semiconductor device and the method of manufacturing the same of the second embodiment of the invention.

Then, as shown in FIG. 14, the N type region (the semiconductor substrate 1) of the LED die 22 and the pad electrode 8a, and the P type region (the P type semiconductor layer 3) of the LED die 22 and the pad electrode 8b are electrically connected using bonding wires 23 made of gold or the like, respectively. Then, the protection layer 12 covering the LED die 22, the bonding wires 23, parts of the pad electrodes 8a, 8b and so on is formed. The protection layer 12 has the openings 11 in the positions corresponding to the pad electrodes 8a, 8b, 8c (not shown) like in the first embodiment, and the method of forming the openings 11 is the same as that of the first embodiment.

Figure 15:
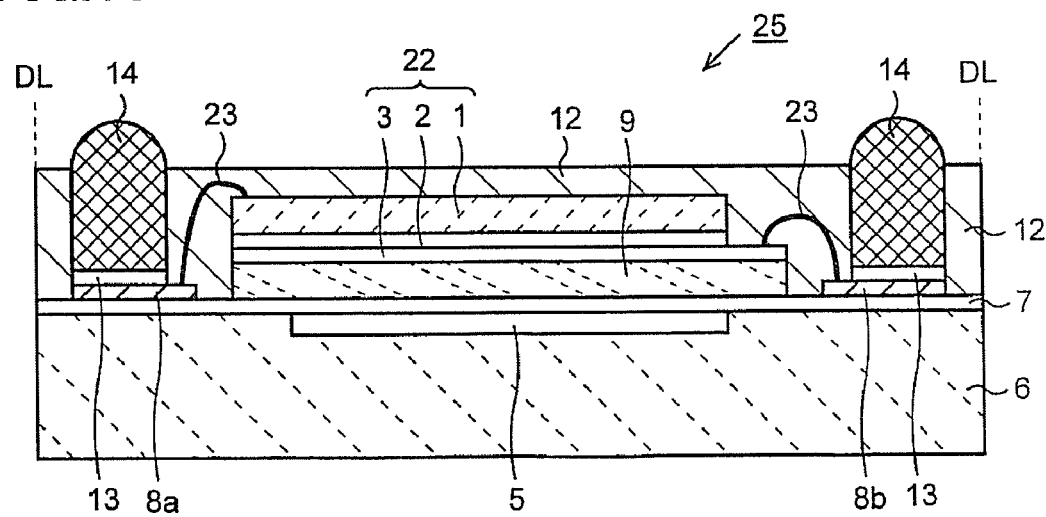
FIG. 15 is a cross-sectional view for explaining the semiconductor device and the method of manufacturing the same of the second embodiment of the invention.

Then, as shown in FIG. 15, the electrode connection layers 13 are formed on the pad electrodes 8a, 8b, 8c in the openings 11. The conductive terminals 14 are then formed on the electrode connection layers 13 by, for example, a screen-printing method. The conductive terminals 14 are electrically connected to the LED die 22 through the electrode connection layers 13 and the bonding wires 23, and electrically connected to the device element 5 through the electrode connection layer 13 and the pad electrode 8c. The protection layer 12, the semiconductor substrate 6 and so on are then cut off along the predetermined dicing lines DL and separated into individual dies.

Figure 16:
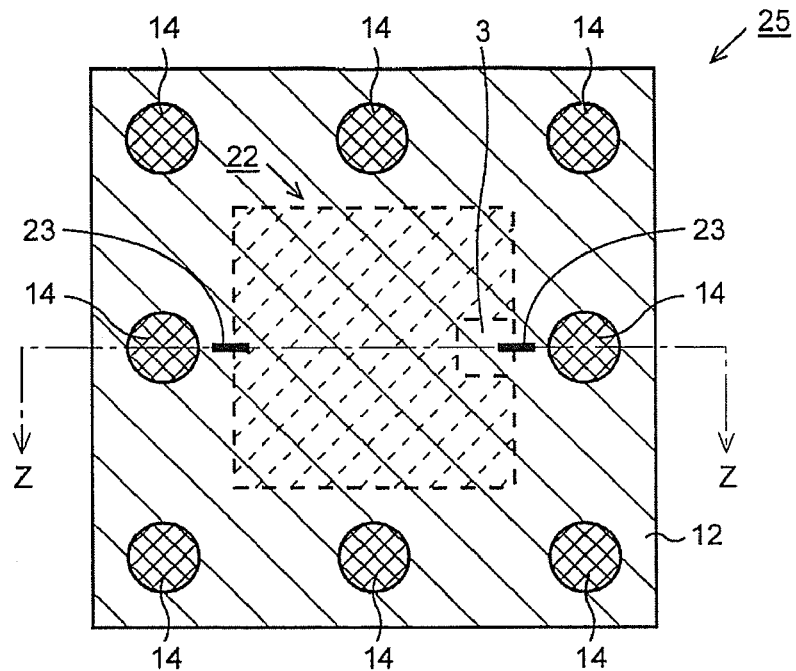
FIG. 16 is a plan view for explaining the semiconductor device and the method of manufacturing the same of the second embodiment of the invention.

By the processes described above, as shown in FIGS. 15 and 16, a semiconductor device 25 of a chip size package type which has the light emitting element (the LED die 22) on the semiconductor substrate 6 is completed. In the semiconductor device 25, the structure of the light emitting element is different from that of the first embodiment (the LED die 4), and realizes power supply from the surface not facing the semiconductor substrate 6 to the LED die 22. FIG. 16 is a schematic plan view of the semiconductor device 25 on the LED die 22 side, and FIG. 15 corresponds to a cross-sectional view of FIG. 16 along line Z-Z.

Like the first embodiment, the second embodiment realizes a thinner and smaller semiconductor device, and the workability and productivity of a semiconductor device having a light emitting element are enhanced. Although the thickness is increased in the embodiment compared with the structure using conductive paste for power supply since power is supplied from the surface not facing the semiconductor substrate 6 to the LED die 22 through the bonding wires 23, a much smaller device than the conventional structure (FIGS. 26 and 27) is still realized.

Figure 17:
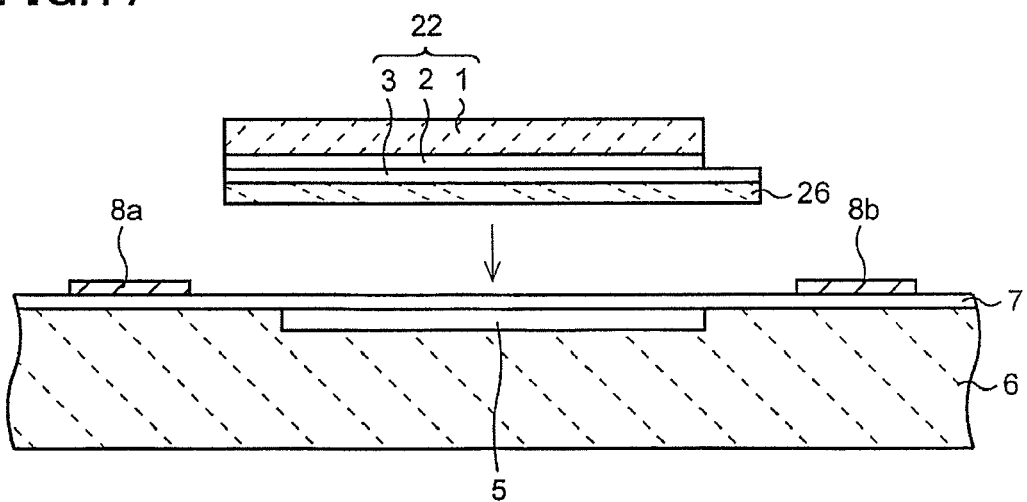
FIG. 17 is a cross-sectional view for explaining the semiconductor device and the method of manufacturing the same of the second embodiment of the invention.

Furthermore, although the wafer-shaped semiconductor substrate 1 is attached to the semiconductor substrate 6 as shown in FIG. 11 and then the LED die 22 is formed through the selective etching process in the second embodiment, the following manufacturing process may be employed instead. First, the die-shaped LED die 22 is manufactured in a different process. Then, this LED die 22 is mounted on the semiconductor substrate 6 with an adhesive layer 26 being interposed therebetween, as shown in FIG. 17. The subsequent processes are the same as above and thus the description is omitted.

Next, a third embodiment of the invention will be described referring to figures. FIGS. 18 to 23 are cross-sectional views in manufacturing process order. The description of the same structure and manufacturing processes as those of the first and second embodiments is omitted or simplified.

Figure 18:
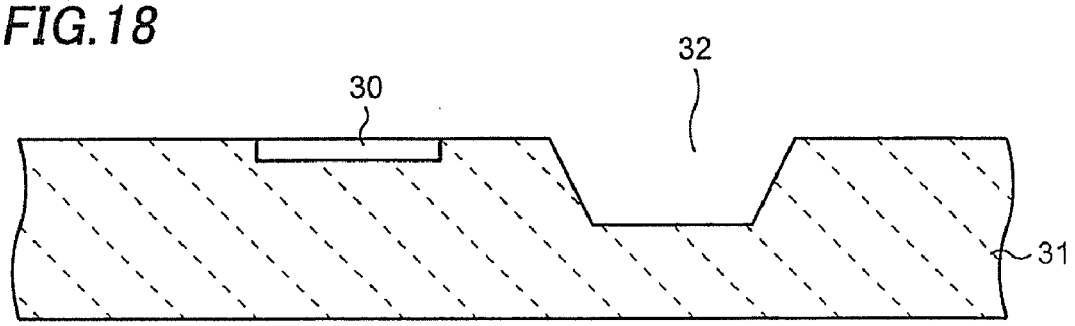
FIG. 18 is a cross-sectional view for explaining a semiconductor device and a method of manufacturing the same of a third embodiment of the invention.

First, as shown in FIG. 18, a wafer-shaped semiconductor substrate 31 made of silicon (Si) or the like having a light receiving element 30 formed on the front surface is provided. The light receiving element 30 includes a photodiode (a Photo Diode), a phototransistor (a Photo Transistor) or the like that are generally known, and has a function of converting light into an electric signal.

Then, the semiconductor substrate 31 is selectively etched using a resist layer (not shown) as a mask to form a low stepped concave portion 32 on the front surface of the semiconductor substrate 31. The concave portion 32 has size such that an LED die 41 that is described below is stored therein, and the depth is about 50 μm for example.

Figure 19:
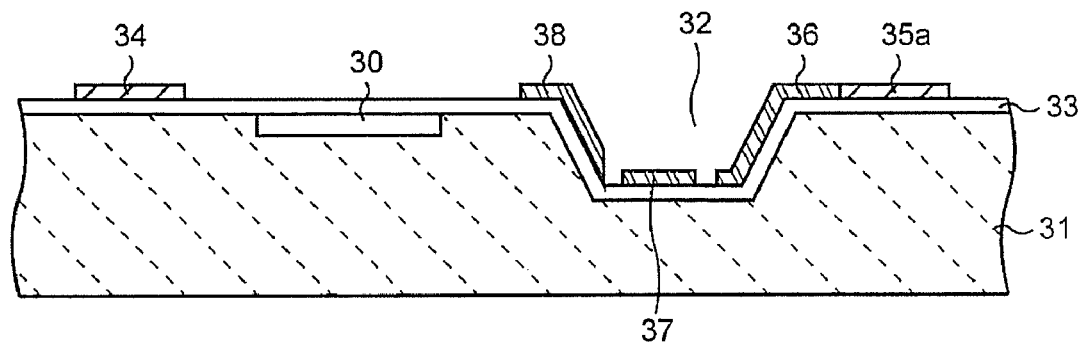
FIG. 19 is a cross-sectional view for explaining the semiconductor device and the method of manufacturing the same of the third embodiment of the invention.
Figure 20:
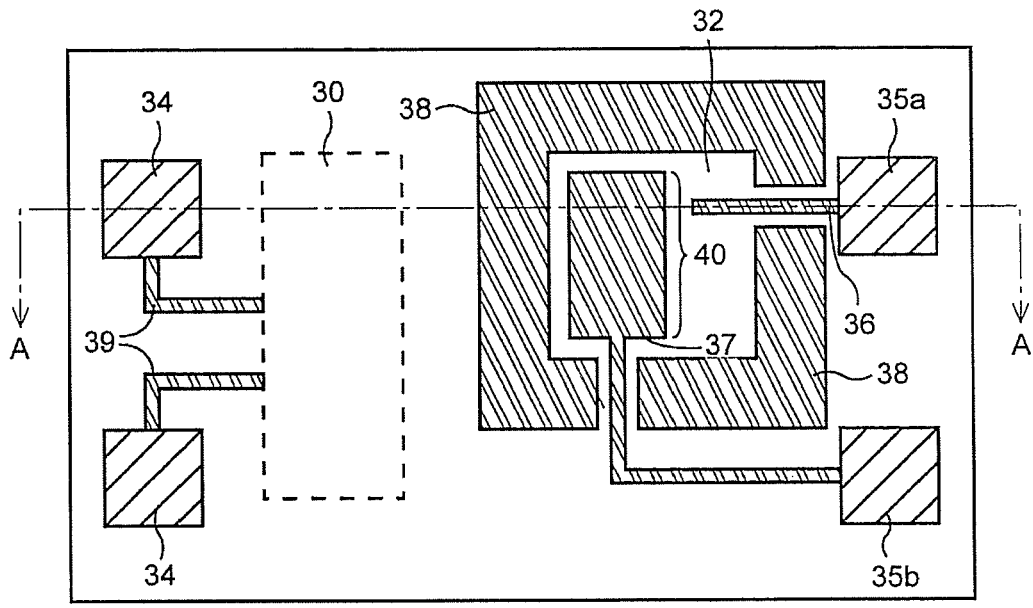
FIG. 20 is a plan view for explaining the semiconductor device and the method of manufacturing the same of the third embodiment of the invention.

Then, as shown in FIG. 19, a first insulation film 33 (e.g. a silicon oxide film formed by a thermal oxidation method, a CVD method or the like) is formed on the front surface of the semiconductor substrate 31. Then, a metal layer made of aluminum (Al), an aluminum alloy, copper (Cu) or the like is formed by a sputtering method, a plating method or other deposition method, and then this metal layer is selectively etched to form a plurality of pad electrodes 34, 35a, 35b, wiring layers 36, 37, a reflection layer 38 and a wiring layer 39 on the first insulation film 33 as shown in FIGS. 19 and 20. FIG. 20 is a schematic plan view showing the front surface of the semiconductor substrate 31, and FIG. 19 corresponds to a cross-sectional view of FIG. 20 along line A-A.

The pad electrodes 34 are electrically connected to the light receiving element 30 through the wiring layers 39. The pad electrodes 35a, 35b are electrodes for external connection that are electrically connected to the LED die 41 that is described below through the wiring layers 36, 37 formed along the inner sidewall of the concave portion 32 from the front surface of the semiconductor substrate 31. Furthermore, as shown in FIG. 20, the wiring layer 37 includes an extension region 40 formed on the bottom of the concave portion 32 and having size such that the LED die 41 that is described below is disposed thereon.

The reflection layer 38 is formed along the inner sidewall of the concave portion 32 as shown in FIGS. 19 and 20, and functions as a light reflection surface. In a case that the material of the semiconductor substrate 31 is silicon, for example, the semiconductor substrate 31 has a function of reflecting light. Therefore, the reflection layer 38 is not necessarily formed.

Figure 21:
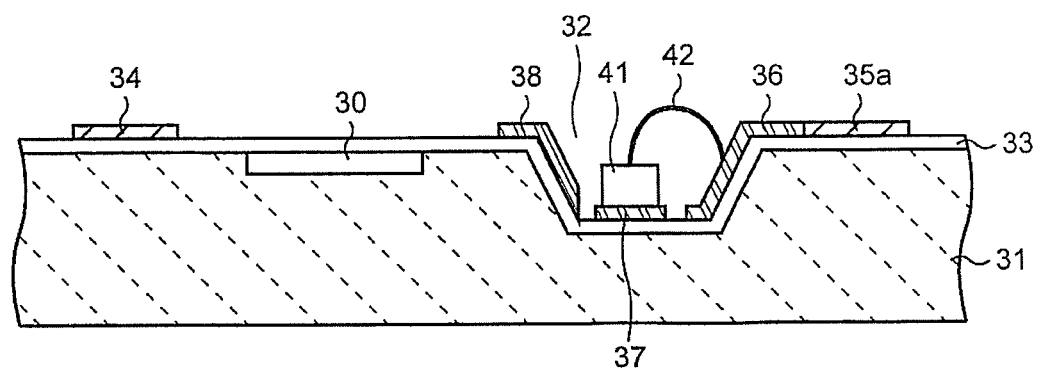
FIG. 21 is a cross-sectional view for explaining the semiconductor device and the method of manufacturing the same of the second embodiment of the invention.

Then, a die-shaped light emitting element (the LED die 41) having a P type region (not shown) on one surface and an N type region (not shown) on other surface is provided. Then, as shown in FIG. 21, the LED die 41 is mounted in the concave portion 32 so as to connect the N type region to the extension region 40 of the wiring layer 37. When the LED die 41 is mounted, a conductive paste (e.g. a silver paste) may be applied to the attachment surface of the LED die 41. Although the metal layer is patterned for forming the pad electrodes 34, 35a, 35b, the wiring layers 36, 37, the reflection layer 38, the wiring layer 39 and so on before the LED die 41 is mounted on the semiconductor substrate 31, the patterning may be performed after the LED die 41 is mounted.

Then, as shown in FIG. 21, one surface (the P type region) of the LED die 41 and the wiring layer 36 are electrically connected through a bonding wire 42 made of gold or the like.

Figure 22:
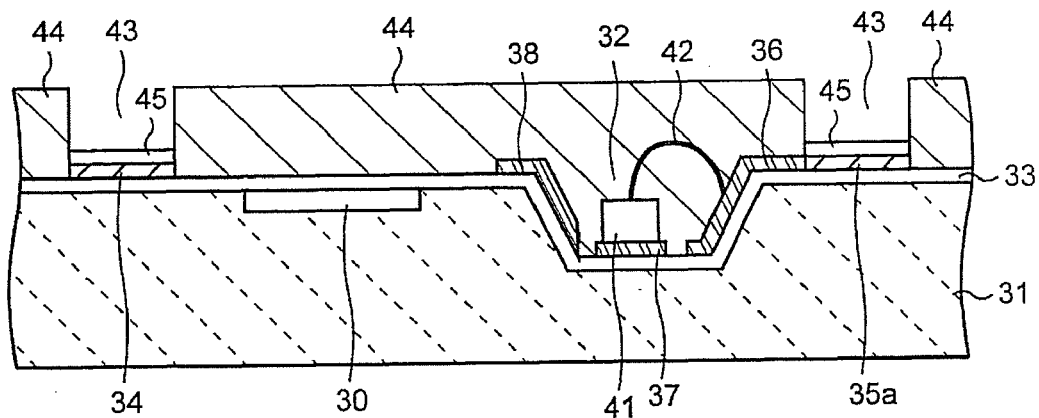
FIG. 22 is a cross-sectional view for explaining the semiconductor device and the method of manufacturing the same of the second embodiment of the invention.

Then, as shown in FIG. 22, a protection layer 44 covering the front surface of the semiconductor substrate 31 including the LED die 41 and the bonding wire 42 and having openings 43 in the positions corresponding to the pad electrodes 34, 35a, 35b is formed. The protection layer 44 is made of a solder resist or the like, and has properties of being transparent and transmitting light. Then, electrode connection layers 45 made of a lamination layer of a nickel layer and a gold layer or the like are formed on the pad electrodes 34, 35a, 35b in the openings 43.

Figure 23:
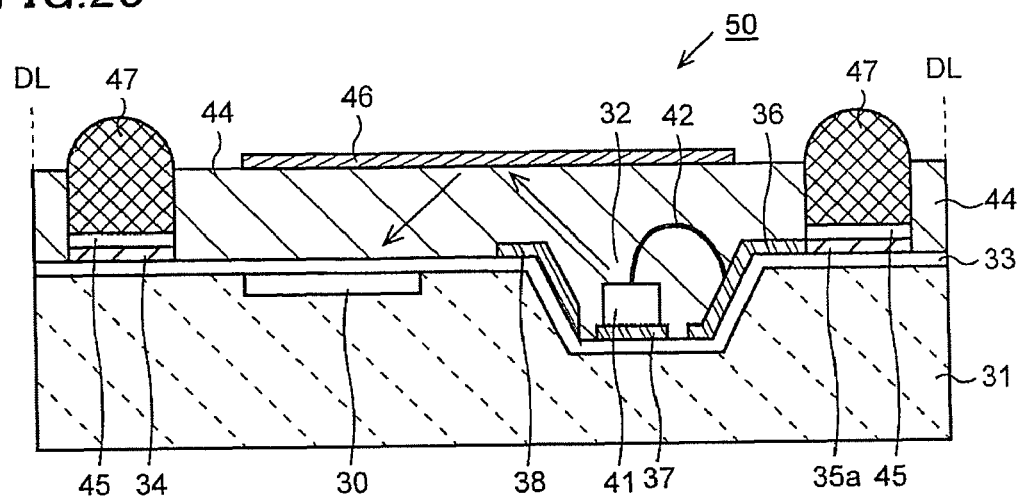
FIG. 23 is a cross-sectional view for explaining the semiconductor device and the method of manufacturing the same of the third embodiment of the invention.

Then, a metal layer made of aluminum (Al), an aluminum alloy, copper (Cu) or the like is formed by a deposition method such as a sputtering method or the like, and then this metal layer is selectively etched to form a reflection layer 46 on the protection layer 44 as shown in FIG. 23. The reflection layer 46 is a layer for reflecting light emitted from the LED die 41 toward the light receiving element 30 as shown by the arrows.

Then, conductive terminals 47 made of solder or the like are formed on the electrode connection layers 45 in the openings 43. By this, the light receiving element 30 is electrically connected to the conductive terminals 47 through the pad electrodes 34, and the LED die 41 is electrically connected to the conductive terminals 47 through the pad electrodes 35a, 35b. Then, the protection layer 44, the semiconductor substrate 31 and so on are cut off along the predetermined dicing lines DL and separated into individual dies.

By the processes described above, a semiconductor device 50 of a chip size package type having the light receiving element 30 and the light emitting element (the LED die 41) on the front surface of the semiconductor substrate 31 is completed as shown in FIG. 23. In the semiconductor device 50, the light receiving element 30 and the reflection layer 46 are formed in addition to the LED die 41. Therefore, the semiconductor device 50 is used as a photocoupler.

The semiconductor device 50 of the third embodiment has the concave portion 32 on the substrate (the semiconductor substrate 31), and the light emitting element (the LED die 41) is formed in the concave portion 32. Furthermore, the layers that reflect light such as the wiring layers 36, 37, the reflection layer 38 and so on are formed on the inner circumference portion of the concave portion 32. Therefore, the inner circumference portion of the concave portion 32 functions as a reflection surface, and enhances the directivity and luminance of light emitted from the LED die 41. In the first and second embodiments, as long as the manufacturing process has a process of mounting a die-shaped light emitting element (the LED dies 4, 22) on the semiconductor substrate 6, the same concave portion may be formed and the light emitting element may be formed in the concave portion.

In the third embodiment, the light emitting element (the LED die 41) and the light receiving element (30) are formed in the planarly spaced positions, and has the reflection layer 46 that reflects light emitted from the light emitting element toward the light receiving element. This structure achieves the formation of a planar photocoupler and realizes a thinner and smaller photocoupler.

Figure 24:
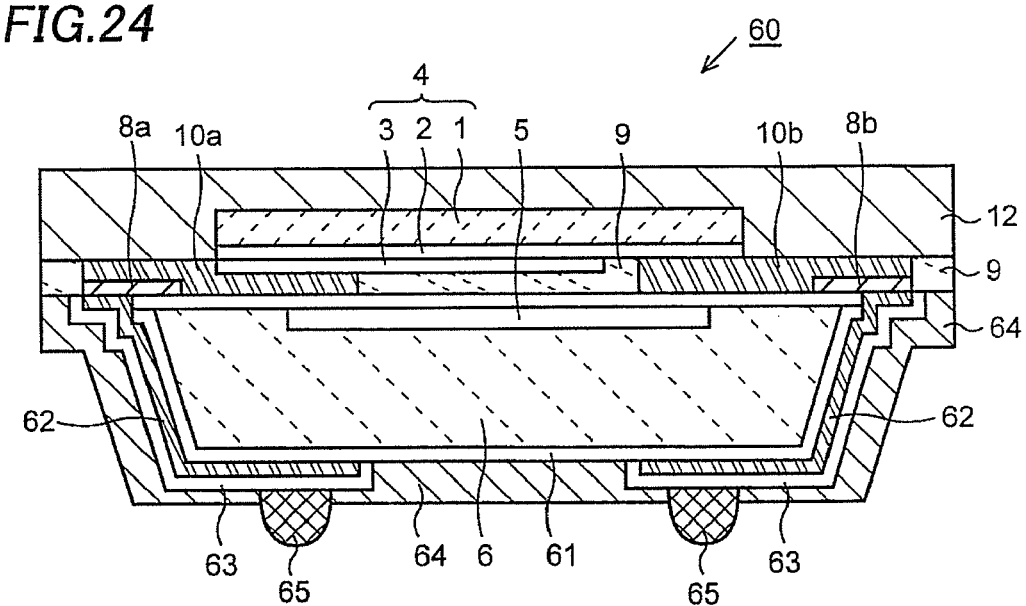
FIG. 24 is a cross-sectional view for explaining a semiconductor device of a modification of the invention.

The invention is not limited to the embodiments described above, and a modification is possible within the scope of the invention. For example, the semiconductor device may be configured as shown in FIG. 24. The same numerals are given to the same components as the components already described, and the description is omitted.

In the semiconductor device 60 shown in FIG. 24, the semiconductor substrate 6 in the positions corresponding to the pad electrodes 8a, 8b, 8c (not shown) are cut from the back surface side by, for example, a dry-etching method or the like. Then, a second insulation film 61 made of a silicon oxide film, a silicon nitride film or the like is formed on the side and back surfaces of the semiconductor substrate 6. Wiring layers 62 made of aluminum or the like electrically connected to the pad electrodes 8a, 8b, 8c are formed on the second insulation film 61 along the side and back surfaces of the semiconductor substrate 6. Furthermore, the electrode connection layers 63 covering the wiring layers 62 are formed. The electrode connection layers 63 are formed by laminating a nickel (Ni) layer and a gold (Au) layer sequentially, like the electrode connection layers 13 described above. Furthermore, a protection layer 64 made of a solder resist or the like is formed so as to cover the electrode connection layers 63, the back surface of the semiconductor substrate 6 and so on. Openings are formed in predetermined regions of the protection layer 64 on the electrode connection layers 63, and conductive terminals 65 are formed in the openings.

Although in the first to third embodiments power is supplied from the front surface side of the semiconductor substrate 6 to the elements (the LED dies 4, 22, the device element 5, the light receiving element 30 and so on) through the conductive terminals (14, 47), power may be supplied from the back surface side of the semiconductor substrate 6 to the elements in this manner. Furthermore, in the structure shown in FIG. 24, since light emitted from the LED die 4 is not blocked by the conductive terminals, the light is effectively emitted to the outside.

Figure 25:
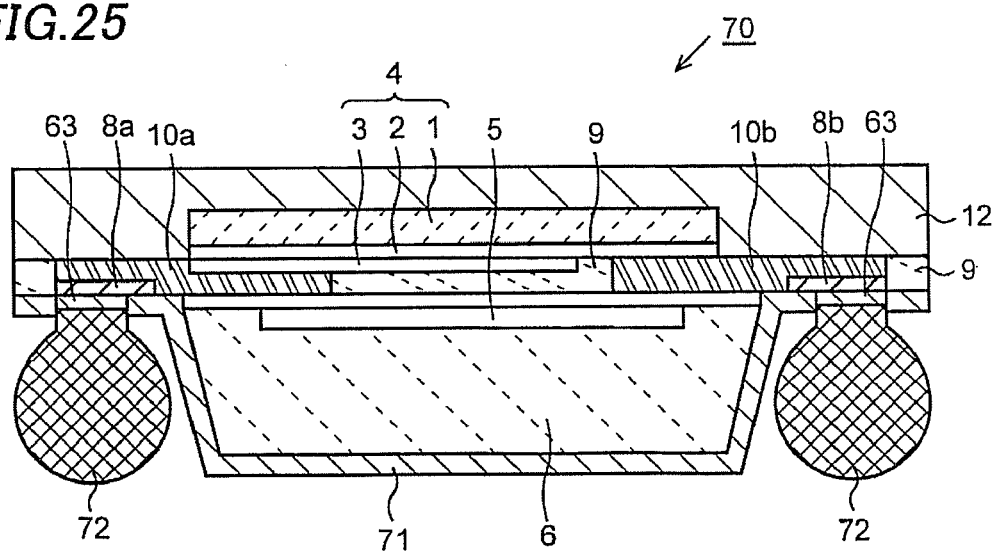
FIG. 25 is a cross-sectional view for explaining a semiconductor device of a modification of the invention.

Furthermore, a semiconductor device may be configured as shown in FIG. 25. In a semiconductor device 70 shown in FIG. 25, a protection layer 71 having openings in the positions corresponding to the pads 8a, 8b, 8c (not shown) and covering the side and back surfaces of the semiconductor substrate 6 is formed. Electrode connection layers 63 are formed on the pad electrodes 8a, 8b, 8c in the positions of the openings of the protection layer 71. Then, conductive terminals 72 made of solder or the like are formed on the electrode connection layers 63. In this manner, the conductive terminals 72 may be formed near the sidewall of the semiconductor substrate 6 instead of the formation of an insulation film (the second insulation film 61 shown in FIG. 24) or a wiring layer (the wiring layer 62) on the side and back surfaces of the semiconductor substrate 6. In this structure, since the process of forming the second insulation film 61 and the wiring layer 62 is not necessary, the manufacturing cost is reduced, compared with the semiconductor device 60. Furthermore, since the conductive terminals 72 are formed near the sidewall of the semiconductor substrate 6, the semiconductor device is thin. Since the etching portion of the semiconductor substrate 6 may be appropriately changed, the conductive terminals 72 may be formed so as to be embedded in the sidewall of the semiconductor substrate 6 and not to be exposed from the side surface of the semiconductor device 70.

Accordingly, the way of supplying power to the elements is appropriately changeable. Although the modifications of the first embodiment are described in FIGS. 24 and 25, the same modifications are also possible for the second and third embodiments. Furthermore, although the description is given about a BGA type semiconductor device having ball-shaped conductive terminals in the embodiments described above, the invention may be also applicable to an LGA (Land Grid Array) type semiconductor device. The invention is widely applicable as a technology of compactly sealing a semiconductor device having a light emitting element.

What is claimed is:

1. A semiconductor device comprising:
   a first substrate;
   a second substrate;
   a first pad electrode and a second pad electrode that are formed on a front surface of the first substrate;
   a light emitting element comprising a region of a first conductive type and a region of a second conductive type and formed on a front surface of the second substrate;
   an adhesive layer attaching the light emitting element to the first substrate;
   a first conductive member disposed between the light emitting element and the first substrate and electrically connecting the region of the first conductive type and the first pad electrode; and
   a second conductive member disposed between the light emitting element and the first substrate and electrically connecting the region of the second conductive type and the second pad electrode.

2. A semiconductor device comprising:
   a first substrate;
   a second substrate;
   a first pad electrode and a second pad electrode that are formed on a front surface of the first substrate;
   a light emitting element comprising a region of a first conductive type and a region of a second conductive type and formed on a front surface of the second substrate;
   an adhesive layer attaching the light emitting element to the first substrate;
   a first conductive member disposed on the first pad electrode so as to be electrically connected to the region of the first conductive type; and
   a second conductive member disposed on the second pad electrode so as to be electrically connected to the region of the second conductive type.

3. The semiconductor device of claim 2, wherein the first conductive member or the second conductive member comprises a bonding wire.

4. The semiconductor device of claim 1, wherein the first conductive member or the second conductive member comprises a conductive paste.

5. The semiconductor device of claim 2, further comprising a protection layer disposed on the front surface of the first substrate so as to cover the light emitting element and a back surface of the second substrate, and conductive terminal disposed in an opening formed in the protection layer so as to be electrically connected to the first or second pad electrode.

6. The semiconductor device of claim 2, further comprising another device element formed on the front surface of the first substrate.

7. The semiconductor device of claim 6, wherein the another device element comprises a light receiving element that converts light emitted from the light emitting element into an electric signal, the semiconductor device further comprising a protection layer covering the light receiving element and the light emitting element.

* * * * *